United States Patent [19]

Pickles et al.

[11] Patent Number: 4,993,956
[45] Date of Patent: Feb. 19, 1991

[54] ACTIVE ELECTRICAL CONNECTOR

[75] Inventors: Charles S. Pickles, Hummelstown; Mansour Zarreii, Mechanicsburg, both of Pa.

[73] Assignee: AMP Incorporated, Harrisburg, Pa.

[21] Appl. No.: 430,230

[22] Filed: Nov. 1, 1989

[51] Int. Cl.⁵ .............................................. H01R 9/09
[52] U.S. Cl. ...................................... 439/76; 439/74; 439/79
[58] Field of Search ...................... 439/68, 70, 71, 76, 439/79, 80, 487, 65, 74, 75, 78; 361/399, 395

[56] References Cited

U.S. PATENT DOCUMENTS

| 3,327,174 | 6/1967 | Barre et al. | 317/101 |
| 3,904,262 | 9/1975 | Cutchaw | 439/487 X |
| 4,047,242 | 9/1977 | Jakob et al. | 361/389 |
| 4,409,641 | 10/1983 | Jakob et al. | 439/487 X |
| 4,603,320 | 7/1986 | Farago | 340/347 DD |
| 4,685,753 | 8/1987 | Isshiki et al. | 439/74 |
| 4,764,122 | 8/1988 | Sorel et al. | 439/74 X |
| 4,772,225 | 9/1988 | Ulery | 439/620 |

Primary Examiner—Neil Abrams
Assistant Examiner—Khiem Nguyen
Attorney, Agent, or Firm—Allan B. Osborne

[57] ABSTRACT

An electrical connector (10) having a cavity (13) for removably receiving a printed circuit board (18) and contact elements (14,16) electrically engaging the board (18) is disclosed. More particularly, the contact elements (14,16) are located on opposing walls (22,24) of the cavity (13) and have contact beams (82,94) that electrically engage conductive pads on the circuit board (18). Further, the contact elements (14,16) have posts (84) and leads (98) extending outwardly of the housing (12) for receiving and transmitting signals from electronic devices. A cover (20) covers the cavity (13) to retain and protect the circuit board (18) therein.

2 Claims, 4 Drawing Sheets

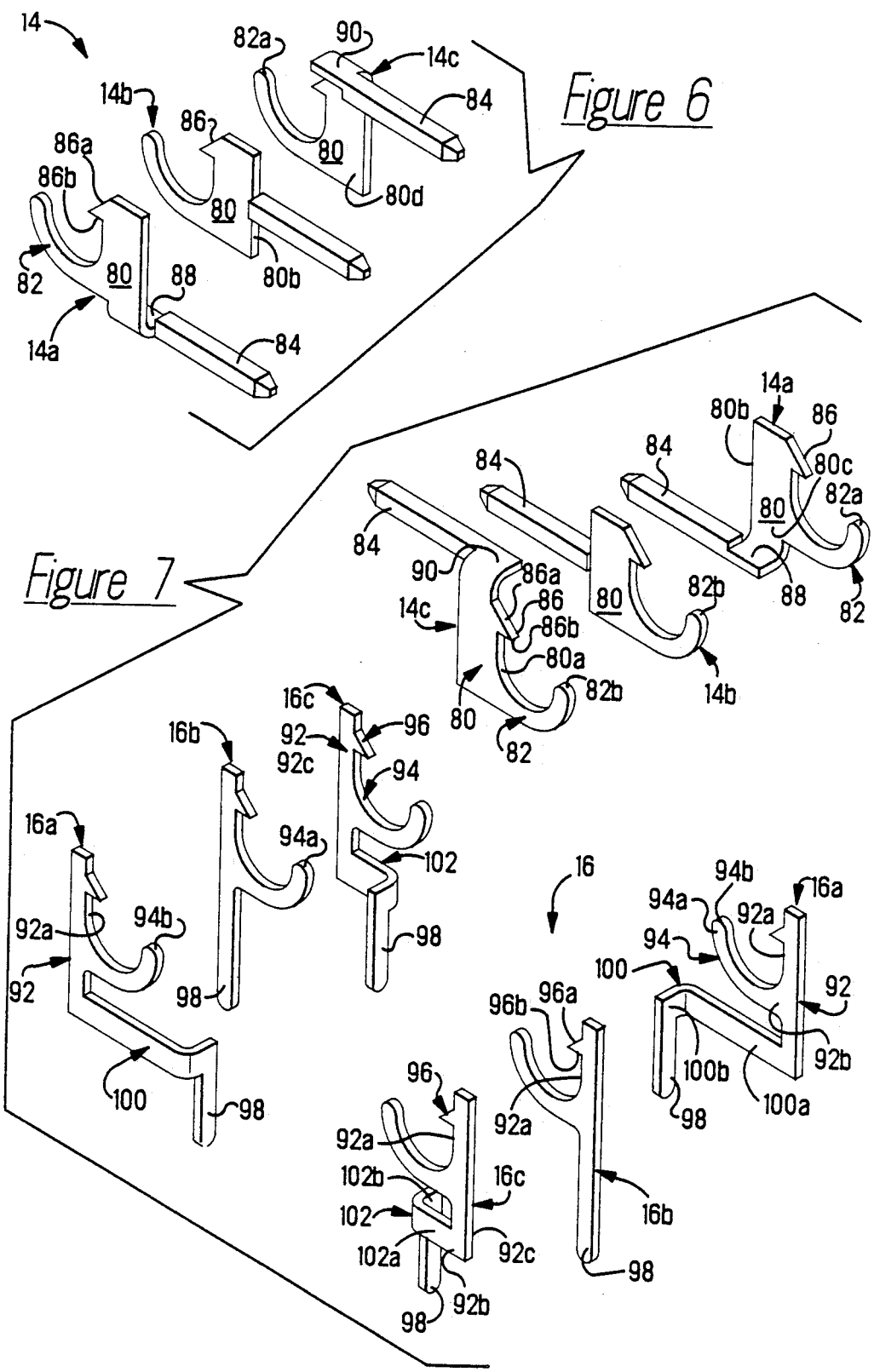

ACTIVE ELECTRICAL CONNECTOR

FIELD OF THE INVENTION

This invention relates to electrical connectors which electrically interconnect electrical components and which contain therein printed circuit boards having electronic devices thereon capable of acting on the signals being transmitted between the contact elements in the connector.

BACKGROUND OF THE INVENTION

Connectors having electronic devices on printed circuit boards between input and output contact elements are well known in the art. For example, U.S. Pat. No. 4,603,320 to Farago discloses one such connector wherein the electronic devices operate to convert incoming data from one format to another before being routed on to a second data handling system. In this known connector, the contact elements include two sets having posts on one end extending outwardly to engage respective data handling systems and posts on the other end within the connector housing which are inserted into a circuit board contained therein. The posts inserted into the circuit board electrically engages circuits which are connected to the electronic devices. As is apparent, such a connector is dedicated to a specific system requiring a specific interface. Thus while the construction is straight forward and simple, it cannot be repaired nor can the functioning of the electronic devices be changed. Accordingly, it is now proposed to provide an electrical connector adapted to receive a printed circuit board therein and which may be easily removed for replacement or repair.

SUMMARY OF THE INVENTION

According to the invention an electrical connector is provided which includes a housing having a cavity for receiving a printed circuit board, contact elements positioned adjacent the front and rear of the housing and having contact beams for engaging conductive pads on opposing edges of the circuit board and a cover for closing the cavity and removably securing the circuit board therein.

BRIEF DESCRIPTION OF THE DRAWINGS

FIG. 6 is a perspective view of the front contact elements of the connector;

FIG. 7 is a perspective view of the rear contact elements of the connector; and

DESCRIPTION OF THE INVENTION

Figure 1:
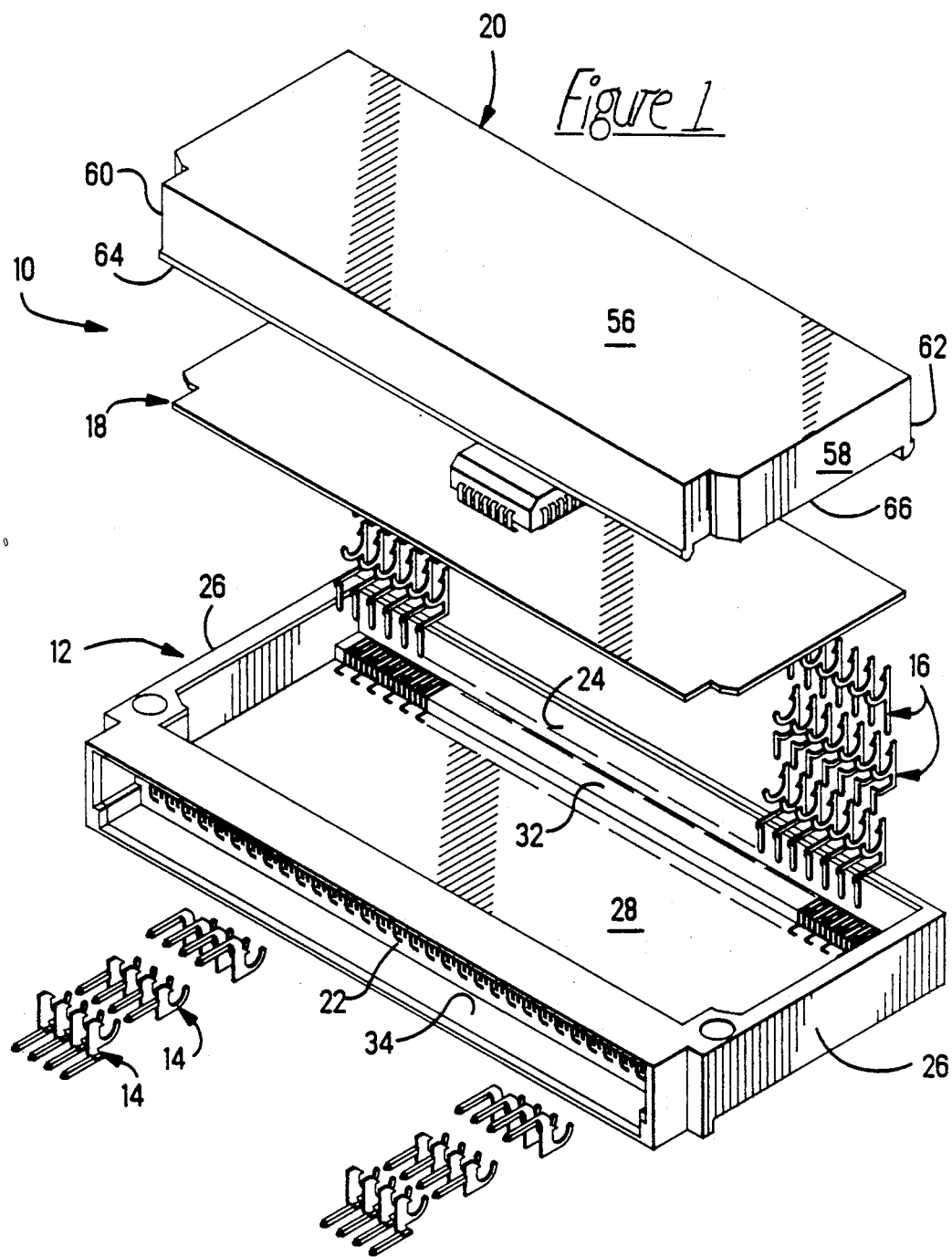
FIG. 1 is an exploded, perspective view of an electrical connector constructed in accordance with the present invention.

Electrical connector 10 as shown in FIG. 1 includes the following components: base housing 12, contact elements 14,16, and cover 20. As will be shown later, connector 10 is adapted to receive printed circuit board 18 between and electrically coupled to contact elements 14,16.

Figure 2:
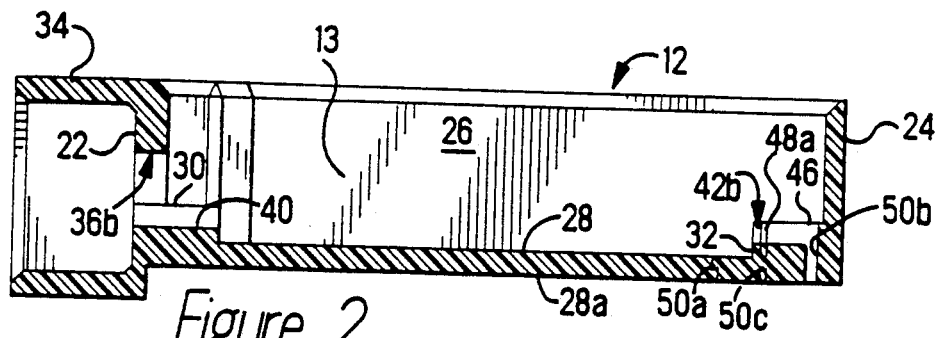
FIG. 2 is a side sectioned view of the base housing of the connector.

Housing 12, shown in FIG. 2, includes upwardly open cavity 13 defined by front wall 22, rear wall 24, side walls 26 and floor 28. Raised portions or ledges 30,32 are provided on floor 28 up against front and rear walls 22,24 respectively. Further, in the illustrated embodiment, front wall 22 is protected by shroud 34.

Figure 3:
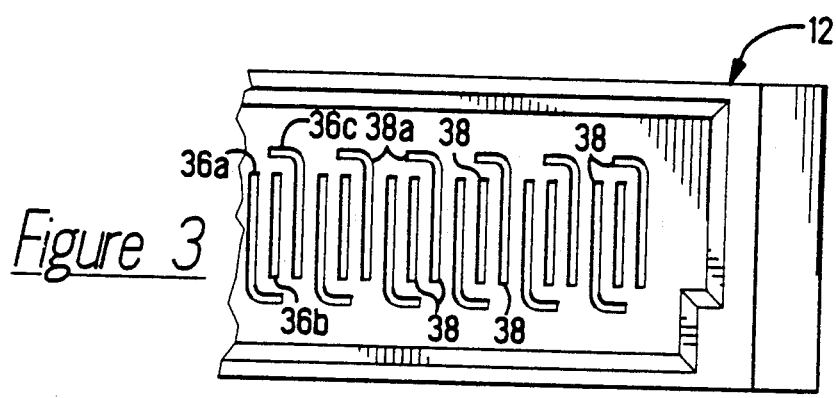
FIG. 3 is a front view of a portion of the housing showing the front passages.

Housing 12 is provided with a plurality of front passages 36 which consists of and are arranged in repeating sets of three and are more specifically designated as passages 36a, 36b and 36c. Each passage 36 includes slot 38 which cuts through front wall 22 as shown in FIGS. 2 and 3. With respect to outside passages 36a,36c of each set, slot 38 includes a short leg 38a which are at respective opposite ends and are turned in towards middle passage 36b. Each passage 36 also includes notch 40 cut into ledge 30 as shown in FIG. 2.

Figure 4:
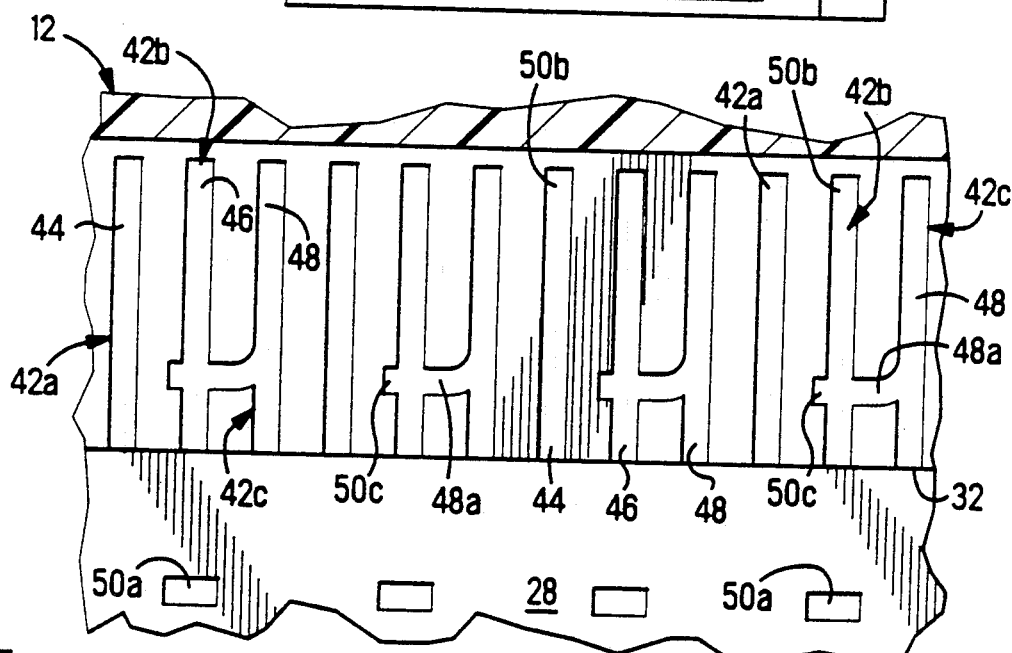
FIG. 4 is a top plan view of a portion of the housing adjacent the rear wall showing the rear passages.

Housing 12 is also provided with a plurality of rear passages 42 which are arranged in repeating sets of three and are more specifically designed as passages 42a, 42b and 42c. As shown in FIGS. 2 and 4, passages 42a, 42b and 42c include notches 44,46 and 48 respectively which are cut into ledge 32. Further included are lead receiving openings 50 which opens out onto underside 28a of floor 28 (FIG. 2). With respect to passage 42a, opening 50a is forward of ledge 32 and is offset to the right (relative to the reader) of notch 44. Opening 50b is at the rear end of notch 46 as shown in FIG. 2. Notch 48, as shown in FIG. 4, includes a right angle, short leg 48a which intersects notch 46 and terminates in opening 50c. All notches 44,46,48 are open at the front edge of ledge 32. Further, as will be more readily understood from the discussion of contact elements 16, the depth of notches 44,48 extend to the level of floor 28. As shown in FIG. 2, notch 46 does not reach to floor 28.

Figure 5:
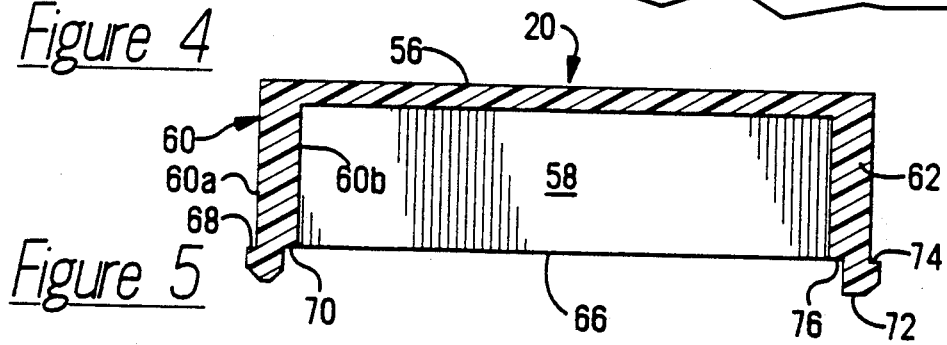
FIG. 5 is a side sectioned view of the cover of the connector.

As shown in FIGS. 1 and 5, cover 20 is defined by top wall 56, side walls 58, front wall 60 and rear wall 62. Free edge 64 of front wall 60, extends below free edges 66 of side walls 58 and includes upwardly facing shoulder 68 on outer surface 60a and downwardly facing shoulder 70 on inner surface 60b. Shoulder 70 is coplanar with free edges 66 of side walls 58.

Free edge 72 of rear wall 62 also extends below free edges 66 of side walls 58. Included as part of free edge 72 are upwardly facing shoulder 74 on outer surface 62a of wall 62 and downwardly facing shoulder 76 on inner surface 62b of wall 62. Shoulder 76 is coplanar with free edges 66 of side walls 58 and shoulder 70 on free edge 64.

Both housing 12 and cover 20 are preferably molded from a suitable dielectric material such as polyphenylene sulfide or polybutylene terephthalate.

Contact elements 14 are shown in FIG. 6 to which reference is now made. Elements 14 include sets of three elements having slightly differing structures and are separately identified as elements 14a,14b and 14c.

Each element 14 has in common plate 80, contact beam 82 and post 84. Plate 80 includes a projecting nose 86 which provides beveled surface 86a and downwardly facing shoulder 86b. As shown, nose 86 projects rearwardly (as elements 14 are oriented in housing 12) from edge 80a of plate 80.

Beam 82 extends generally rearwardly from the lower portion of plate 80 and curves upwardly at its distal end 82a. Beam 82 preferably is somewhat resilient. Distal end 82a preferably is plated with a noble metal; e.g., gold, particularly on the free edge tip 82b.

Posts 84 are shown as being square in cross-section but could be round, flat or rectangular depending upon the type of mating receptacle (not shown). With respect to element 14a, post 84 is offset relative to the plane of plate 80 by means of strap 88 which is attached to and extends outwardly from side 80c at the lower edge of plate 80. Post 84 of element 14b is attached to and extends forwardly from edge 80b of plate 80 intermediate the upper and lower edges thereof. With respect to element 14c, post 84 thereon is offset relative to the plane of plate 80 by means of strap 90 which is attached to and extends outwardly from side 80d at the upper edge of plate 80. As shown posts 84 on respective elements 14a and 14c are offset in opposite directions and from opposite edges of the respective plates 80. These structural differences are predetermined by front passages 36a,36c (FIG. 3).

Contact elements 16, shown in FIG. 7, also are made in sets of three elements each with each element of the set having a slightly different configuration and accordingly are identified as elements 16a,16b and 16c.

Each element 16 has in common vertical stem 92 and contact beam 94. Beam 94 is attached to and extends forwardly from edge 92a of stem 92. As is with beams 82 on elements 14, beams 94 curve upwardly at distal ends 94a with the free edge tip 94b preferably being plated with a noble metal. Nose 96, located near the top of stem 92 also projects forwardly from edge 92a and includes beveled surface 96a and downwardly facing shoulder 96b.

Figure 8:
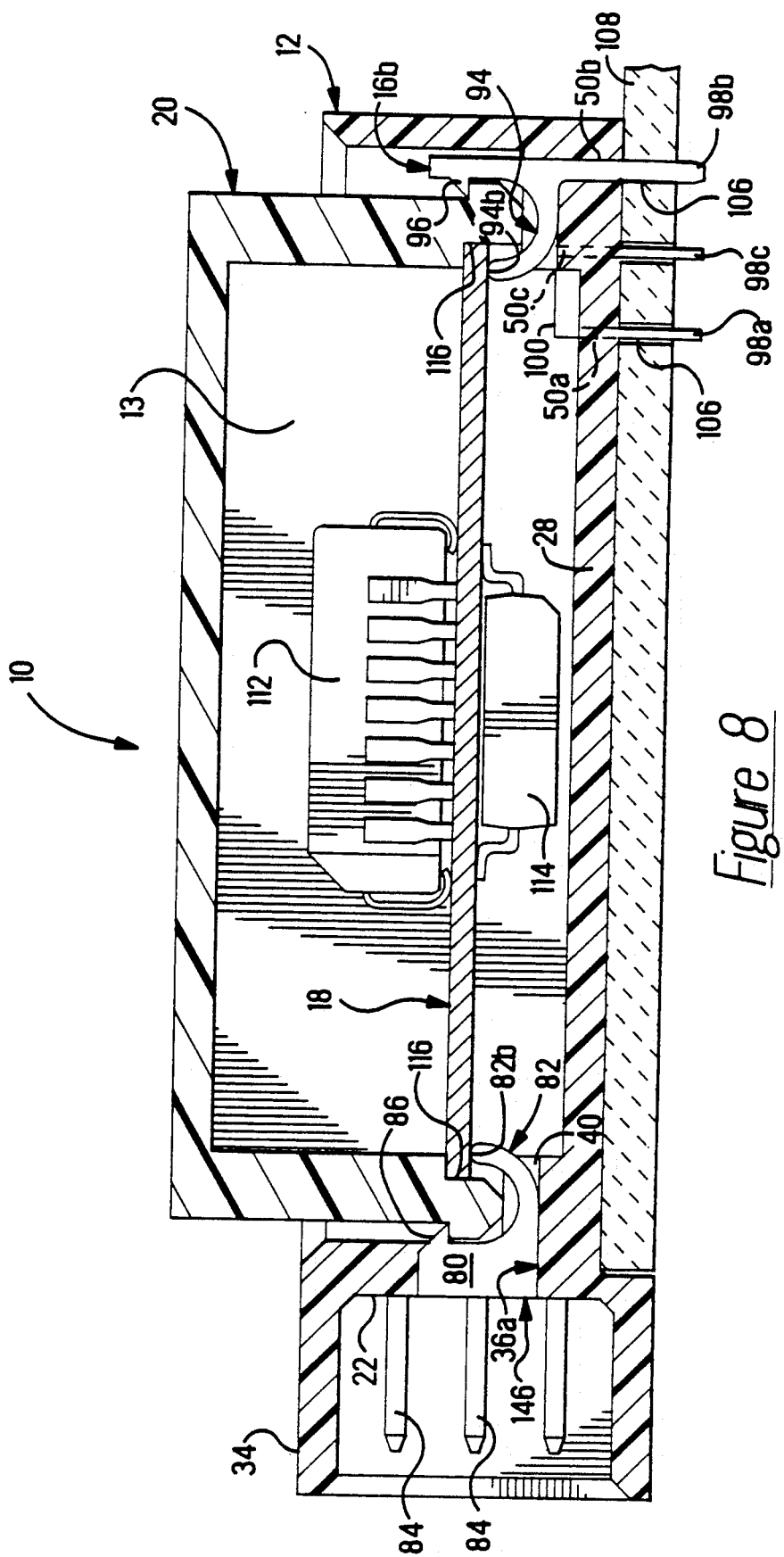
FIG. 8 is a side sectioned view of an assembled connector.

Each element 16 also includes a lead 98 which is adapted to electrically engage circuits (not shown) on a back panel (FIG. 8). The lead 98 illustrated is adapted to be inserted and soldered in a plated through hole (not shown) in the panel: however, other types could be used; e.g. a compliant pin or a lead having a solder foot for being soldered to the surface of the panel. With respect to element 16a, lead 98 is forward and offset relative to side 92b of stem 92 by means of L-shaped strap 100 which is attached to edge 92a of stem 92 at its lower end. Strap 100 includes a long portion 100a which is coplanar with stem 92 and a short portion 100b which is at right angles thereto. Lead 98 is attached to and depends from short portion 100b.

Lead 98 on contact element 16b is attached to the lower end of stem 92 and extends downwardly therefrom on the same plane.

Lead 98 on element 16c is forward and offset relative to side 92c of stem 92 by means of L-shaped strap 102. Strap 102, which is attached to edge 92a, includes first portion 102a which is coplanar with the plane of stem 92 and second portion 102b which is at right angles thereto. Lead 98 is attached to and extends downwardly from the free end of second portion 102b. As can be seen, leads 96 on respective elements 16a,16c are offset relative to stems 92 in opposite directions which reflect the structures of rear passages 42a,42c (FIG. 4).

Contact elements 14,16 are preferably stamped and formed from beryllium copper or phosphor bronze alloy.

With reference to FIG. 8, contact elements 14a, b and c are loaded into front passages 36a, b and c respectively with posts 84 extending forwardly into shroud 34. Plates 80 are positioned in slots 38 and straps 88,90 on elements 14a,14c respectively are positioned in short legs 38a of respective slots 36a,36c. Contact beams 82 extend rearwardly through notches 40 and into cavity 13. Noses 86 project into cavity 13 from front wall 22.

Contact elements 16a, b and c are loaded into rear passages 42a, b and c respectively with leads 98 extending downwardly through floor 28 and into holes 106 in back panel 108. Stems 92 are adjacent rear wall 24 with contact beams 94 extending forwardly into cavity 13 through respective notches 44,46,48. Strap 100 on element 16a extends forwardly through notch 44 and lead 98a thereon extends through opening 50a. Strap 102 is positioned in notch 48 with second portion 102b being in notch leg 48a (FIG. 4). Lead 98c extends down through opening 50c. Lead 98b extends through opening 50b as shown in FIG. 8. In loading contact elements 16, elements 16c must be in place before elements 16b because of short leg 102b crossing over notch 46. Noses 96 project forwardly into cavity 13 from stems 92.

As illustrated, contact elements 14,16 are in line with each other across cavity 13. However, the present invention contemplates other arrangements; i.e., contacts 14,16 may be on different pitches as required.

With continuing reference to FIG. 8, printed circuit board 18 has various electronic packages; e.g., surface mount cerquad package 112 and IC package 114, mounted thereon as desired by the end user. Circuit board 18 is placed in cavity 13 with conductive pads (not shown) on opposite edges 116 engaging respective plated tips 82b on beams 82 on elements 14 and plated tips 94b on beams 94 on elements 16.

With circuit board 18 in cavity 13, cover 20 is placed in position to removably secure it and to protect it environmentally. Walls 58,60 and 62 fit within cavity 13 and held in place by respective downwardly facing shoulders 86b on noses 86 on elements 14 and downwardly facing shoulders 96b on noses 96 on elements 16 engaging upwardly facing shoulders 68,74 respectively on respective front and rear walls 60,62. Circuit board 18 is held in place and urged against contact beams 82,94 by respective downwardly facing shoulders 70,76 on the cover's front and rear walls 60,62 respectively. Beams 82,94 are prevented from being over stressed by free edges 64,72 on walls 60,62 respectively engages respective ledges 30,32.

The aforementioned means for latching cover 20 to contact elements 14,16 illustrates just one of many ways to accomplish that result. Other equally suitable means can be employed. For example, well known latching means may be placed on housing 12 and cover 20 to accomplish the same purpose. Another example, inwardly projecting noses having downwardly facing shoulders (not shown) on side walls 26 of housing 12 would cooperate with cut-out portions (not shown) on side walls 58 of cover 20 to secure the cover 20 and circuit board 18. However, a notable advantage of latching cover 20 as illustrated is that housing 12 is not subject to any forces thereagainst and therefore plastic creep is not a problem.

As can be discerned, an electrical connector adapted to removably receive a printed circuit board between input/output contact elements has been disclosed. The connector includes a housing having contact element positioned at opposite ends and a cavity for receiving a printed circuit board carrying electronic packages and the like which will operate on incoming signals. The contact elements include contact beams which engage conductive traces or pads on the edges of the printed circuit board. A cover fits into the housing cavity to protect the circuit board as well as to urge it against the contact elements.

I claim:

1. An electrical connector comprising:
   an insulating housing having an outwardly open cavity defined by front, rear and side walls and a floor, said cavity adapted to receive a printed circuit board therein with the plane of the board being parallel to said floor;
   a plurality of conductive contact element disposed adjacent front and rear walls in said housing and having electrical engaging means extending outwardly therefrom for electrically engaging other electrical means and further having contact beams positioned in said cavity for electrically engaging respective conductive pads on opposing edges on a printed circuit board which may be removable but placed in said cavity; and
   a cover, removably placed on said housing to cover said cavity with cooperating means on said contact elements and on said cover for removably latching said cover to said housing.

2. An electrical connector of the type adapted to receive a printed circuit board having conductive pads at the edges of a pair of opposite sides, said connector comprising:
   a housing of dielectric material having an outwardly open cavity defined by front and rear walls, side walls and a floor, said cavity adapted to receive the printed circuit board therein, said front wall being provided with a plurality of passages therethrough and said floor adjacent said rear wall being provided with a plurality of openings therethrough;
   a plurality of front contact elements disposed in said passages and having contact beams extending into said cavity with said beams having an outwardly facing free end for electrically engaging the pads on one edge of the printed circuit board which may be placed in said cavity;
   a plurality of rear contact elements having leads extending outwardly through said openings and forwardly projecting contact beams, said contact beams having an outwardly facing free end for electrically engaging the pads on another edge of the printed circuit board which may be placed in said cavity; and
   a cover for covering said cavity and for protecting the printed circuit board which may be positioned therein with cooperating means on said front and rear contact elements and on said cover for removably latching said cover to said housing.

* * * * *

UNITED STATES PATENT OFFICE
CERTIFICATE OF CORRECTION

Patent No. 4,993,956          Dated February 19, 1991

Inventor(s) Charles Pickles and Mansour Zarreii

It is certified that error appears in the above-identified patent and that said Letters Patent is hereby corrected as shown below:

Claim 1, Line 10, Column 5 - the word "element" should be --elements--.

Signed and Sealed this

Eighth Day of September, 1992

Attest:

DOUGLAS B. COMER

*Attesting Officer*     *Acting Commissioner of Patents and Trademarks*